(12) United States Patent
Kim et al.

(10) Patent No.: US 8,692,261 B2
(45) Date of Patent: Apr. 8, 2014

(54) LIGHT EMITTING DEVICE GROWN ON A RELAXED LAYER

(75) Inventors: Andrew Y. Kim, San Jose, CA (US); Patrick N. Grillot, San Jose, CA (US)

(73) Assignees: Koninklijke Philips N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 265 days.

(21) Appl. No.: 12/783,197

(22) Filed: May 19, 2010

(65) Prior Publication Data

US 2011/0284890 A1 Nov. 24, 2011

(51) Int. Cl.
*H01L 27/15* (2006.01)
(52) U.S. Cl.
USPC ............ 257/79; 257/190; 257/E33.034
(58) Field of Classification Search
USPC ............ 257/79, 103, 190, E33.025, E33.033, 257/E33.034
See application file for complete search history.

(56) References Cited

U.S. PATENT DOCUMENTS

| | | | |
|---|---|---|---|
| 6,495,867 | B1 | 12/2002 | Chen et al. |
| 6,956,247 | B1 | 10/2005 | Stockman |
| 7,012,279 | B2 | 3/2006 | Wierer, Jr. et al. |
| 7,279,718 | B2 | 10/2007 | Krames |
| 7,294,862 | B2 | 11/2007 | Wierer, Jr. et al. |
| 7,442,964 | B2 | 10/2008 | Wierer, Jr. et al. |
| 7,442,965 | B2 | 10/2008 | Wierer, Jr. et al. |
| 7,547,908 | B2 | 6/2009 | Grillot et al. |
| 7,642,108 | B2 | 1/2010 | Krames et al. |
| 2004/0087055 | A1* | 5/2004 | Ledentsov ................. 438/77 |
| 2007/0096130 | A1 | 5/2007 | Schiaffino et al. |
| 2008/0149946 | A1* | 6/2008 | Kim et al. ................. 257/89 |
| 2008/0149961 | A1* | 6/2008 | Grillot et al. ............ 257/99 |
| 2009/0267091 | A1 | 10/2009 | Kinoshita et al. |
| 2010/0072516 | A1* | 3/2010 | Tamura et al. ........... 257/192 |
| 2011/0182311 | A1 | 7/2011 | Yoshizumi et al. |

FOREIGN PATENT DOCUMENTS

| | | |
|---|---|---|
| EP | 0977279 A2 | 2/2000 |
| WO | 2007096405 A1 | 8/2007 |
| WO | 2010041657 A1 | 4/2010 |

OTHER PUBLICATIONS

Lin et al., "High-efficiency InGaN-based light-emitting diodes with nanoporous GaN:Mg structure," Appl. Phys. Lett. 88, 083121 (2006).*
Ke et al., Application of Nanosphere Lithography to LED Surface Texturing and to the Fabrication of Nanorod LED Arrays, IEEE Journal of Selected Topics in Quantum Electronics, vol. 15, No. 4, Jul./Aug. 2009, pp. 1242-1247.*
A. Dadgar et al, Bright, Crack-Free InGaN/GaN Light Emitters on Si(111), Phys. Stat. Sol. (a) 192, No. 2, pp. 308-313, 2002.

* cited by examiner

*Primary Examiner* — Julia Slutsker

(57) ABSTRACT

In some embodiments of the invention, a device includes a first semiconductor layer, a second semiconductor layer, a third semiconductor layer, and a semiconductor structure comprising a III-nitride light emitting layer disposed between an n-type region and a p-type region. The second semiconductor layer is disposed between the first semiconductor layer and the third semiconductor layer. The third semiconductor layer is disposed between the second semiconductor layer and the light emitting layer. A difference between the in-plane lattice constant of the first semiconductor layer and the bulk lattice constant of the third semiconductor layer is no more than 1%. A difference between the in-plane lattice constant of the first semiconductor layer and the bulk lattice constant of the second semiconductor layer is at least 1%. The third semiconductor layer is at least partially relaxed.

13 Claims, 2 Drawing Sheets

LIGHT EMITTING DEVICE GROWN ON A RELAXED LAYER

BACKGROUND

1. Field of Invention

The present invention relates to a semiconductor light emitting device grown on a semiconductor layer that is at least partially relaxed.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

As used herein, an "in-plane" lattice constant refers to the actual lattice constant of a layer within the device, and a "bulk" lattice constant refers to the lattice constant of relaxed, free-standing material of a given composition. The amount of strain in a layer is defined as $|a_{in\text{-}plane} - a_{bulk}|/a_{bulk}$.

When a III-nitride device is conventionally grown on sapphire, the first structure grown on the substrate is generally a GaN template layer with an in-plane a-lattice constant of about 3.189 Å or less. The GaN template serves as a lattice constant template for the light emitting region in that it sets the lattice constant for all the strained device layers grown above the template layer, including the InGaN light emitting layer. Since the bulk lattice constant of InGaN is larger than the in-plane lattice constant of the conventional GaN template, the light emitting layer is compressively strained when grown over a conventional GaN template. For example, a light emitting layer configured to emit light of about 450 nm may have a composition $In_{0.16}Ga_{0.84}N$, a composition with a bulk lattice constant of 3.242 Å, as compared to the lattice constant of GaN, 3.189 Å. As the InN composition in the light emitting layer increases, as in devices designed to emit light at longer wavelengths, the compressive strain in the light emitting layer also increases.

FIG. 1 illustrates the epitaxial structure of an LED described in more detail in U.S. Pat. No. 7,547,908. A conventional low temperature nucleation layer 22 is grown directly on the surface of a sapphire substrate 20. Nucleation layer 22 is typically a low quality, non-single crystal layer such as an amorphous, polycrystalline, or cubic phase GaN layer grown to a thickness of, for example, up to 500 Å, at a temperature between 400 and 750° C. A second low temperature layer 26 is grown above nucleation layer 22. Low temperature layer 26 may be a low quality, non-single crystal layer such as an amorphous, polycrystalline, or cubic phase III-nitride layer grown to a thickness of up to 500 Å at a temperature between 400 and 750° C. Low temperature layer 26 may be InGaN, such that low temperature layer 26 increases the lattice constant of device layers 10 including an InGaN light emitting layer beyond the range of lattice constants achievable with conventional nucleation structures such as a conventional GaN template. In some examples, low temperature layer 26 is AlGaN or AlInGaN, such that low temperature layer 26 decreases the lattice constant established by nucleation layer 22 in order to decrease the tensile strain in the AlGaN light emitting region of a UV device. The light emitting active layers of such devices may be, for example, AlGaN or AlInGaN.

SUMMARY

It is an object of the invention to provide a semiconductor light emitting device that efficiently emits light.

In some embodiments of the invention, a device includes a first semiconductor layer, a second semiconductor layer, a third semiconductor layer, and a semiconductor structure comprising a III-nitride light emitting layer disposed between an n-type region and a p-type region. The second semiconductor layer is disposed between the first semiconductor layer and the third semiconductor layer. The third semiconductor layer is disposed between the second semiconductor layer and the light emitting layer. The difference between the in-plane lattice constant of the first semiconductor layer and the bulk lattice constant of the third semiconductor layer is no more than 1%. The difference between the in-plane lattice constant of the first semiconductor layer and the bulk lattice constant of the second semiconductor layer is at least 1%. The third semiconductor layer is at least partially relaxed.

In some embodiments, a method comprises growing a first semiconductor layer, growing a second semiconductor layer, growing a third semiconductor layer, and growing a semiconductor structure comprising a III-nitride light emitting layer disposed between an n-type region and a p-type region. The second semiconductor layer is disposed between the first semiconductor layer and the third semiconductor layer. The third semiconductor layer is disposed between the second semiconductor layer and the light emitting layer. The difference between an in-plane lattice constant of the first semiconductor layer and a bulk lattice constant of the third semiconductor layer is no more than 1%. The difference between an in-plane lattice constant of the first semiconductor layer and a bulk lattice constant of the second semiconductor layer is at least 1%. The third semiconductor layer is at least partially relaxed.

In some embodiments, the difference between the in-plane lattice constant of the first semiconductor layer and the bulk lattice constant of the second semiconductor layer is sufficiently large that the second semiconductor layer at least partially relaxes. The difference between the bulk lattice constant of the third semiconductor layer and the in-plane lattice constant of the first semiconductor layer is sufficiently small that the third semiconductor layer at least partially relaxes when grown on the second semiconductor layer. The in-plane lattice constant of the third semiconductor layer may therefore be larger than the in-plane lattice constant of conventional growth templates. A light emitting layer may be grown over the third semiconductor layer with less strain than a light emitting layer grown over a conventional growth template, which may improve the performance of the device.

DETAILED DESCRIPTION

In embodiments of the invention, a III-nitride device includes two layers, a lattice mismatched layer and a relaxed layer grown on the lattice mismatched layer. The lattice mismatched layer is selected to have an extremely high lattice mismatch to the relaxed layer. The mismatch forces the relaxed layer to relax. The relaxed layer may be one of the device layers, though it need not be.

Though in the examples below the semiconductor device is a III-nitride LED that emits visible or UV light, embodiments of the invention may be included in other semiconductor optoelectronic or electronic devices besides LEDs, such as laser diodes, field effect transistors, and detectors, and devices fabricated in other materials systems such as AlGaInP, AlGaInAs, and AlGaInAsP.

Figure 1:
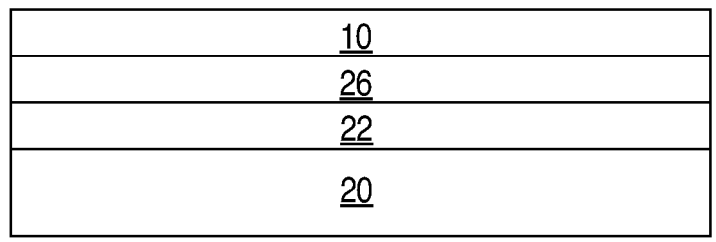
FIG. 1 illustrates a prior art III-nitride epitaxial structure grown on a sapphire substrate.
Figure 2:
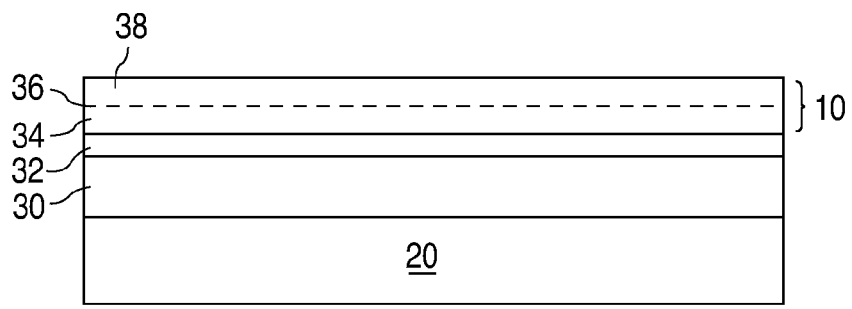
FIG. 2 illustrates a III-nitride epitaxial structure including a relaxed layer grown on a GaN layer.

FIG. 2 illustrates an epitaxial structure grown on a growth substrate 20 according to embodiments of the invention. A first layer 30 is grown on substrate 20, which may be, for example, SiC, $Al_2O_3$, Si, a composite substrate, or any other suitable substrate. The first layer 30 may be, for example, GaN, InGaN, AlN, AlGaN, or AlInGaN and may be n-type, p-type, or not intentionally doped. In some embodiments, electrical contact to the n-type region of the device layers 10 is established by a metal contact formed on the first layer 30. Accordingly, in some embodiments, first layer 30 is doped with an n-type dopant to a dopant concentration suitable for a contact layer.

A lattice mismatched layer 32 is grown on first layer 30. Lattice mismatched layer 32 is selected to have a bulk lattice constant that is different from the layer grown over lattice mismatched layer 32, which is all or part of n-type region 34 in the structure illustrated in FIG. 2. The difference between the bulk lattice constants of the lattice mismatched layer 32 and the layer grown directly over it is at least 2% in some embodiments and at least 1% in some embodiments. Lattice mismatched layer 32 has a bulk lattice constant less than 3.18 Å, less than 3.17 Å in some embodiments, less than 3.16 Å in some embodiments, and less than 3.15 Å in some embodiments. For example, lattice mismatched layer 32 may be AlN, which has a bulk lattice constant of 3.11 Å, or AlGaN with an AlN composition of at least 30%, which has a bulk lattice constant of no more than 3.165 Å. The layer grown directly on lattice mismatched layer 32 may be GaN, which has a bulk lattice constant of 3.189 Å; InGaN, which has a bulk lattice constant greater than that of GaN; or AlInGaN. An InGaN layer grown directly on lattice mismatched layer 32 has an InN composition greater than 0 and up to 10% in some embodiments, between 1% and 6% in some embodiments, and 3% in some embodiments.

For purposes of the present application, the bulk lattice constant of a ternary or quaternary III-nitride compound $A_xB_yC_zN$ may be calculated according to Vegards law, where $a_{x,y,z} = x(a_{AN}) + y(a_{BN}) + z(a_{CN})$, where a refers to the bulk lattice constants of the binary compounds. AlN has a bulk lattice constant of 3.111 Å, InN has a bulk lattice constant of 3.533 Å, and GaN has a bulk lattice constant of 3.189 Å.

The lattice mismatched layer 32 has a thickness greater than 10 nm in some embodiments, between 10 nm and 500 nm in some embodiments, between 20 nm and 200 nm in some embodiments, and between 50 nm and 100 nm in some embodiments. The lattice mismatched layer may remain in the device or it may be removed. The lattice mismatched layer 32 may be doped, for example in embodiments where it remains in the device and is disposed between the light emitting region and the n-type layer on which the metal contact is formed. In embodiments where light is extracted from the device through the lattice mismatched layer, an absorbing lattice mismatched layer may be made as thin as possible.

The lattice mismatch between lattice mismatched layer 32 and the layer grown directly on the lattice mismatched layer is so great that the layer grown directly on the lattice mismatched layer is unable to align with the lattice of the lattice mismatched layer. As a result, the initial portion of the layer grown directly on lattice mismatched layer 32 includes a large number of defects, then the layer partially or fully relaxes. The growth conditions may be selected such that the layer relaxes over a relatively small thickness. The thickness over which the layer grown directly on the lattice mismatched layer relaxes (i.e. the defect-rich region thickness) is less than 500 nm in some embodiments, less than 200 nm in some embodiments, and less than 100 nm in some embodiments. The thickness over which this layer relaxes in some embodiments is kept as thin as possible, to reduce alloy decomposition for example in the case of a ternary layer, and to limit the feature size of surface roughness to the scale of the thickness necessary for relaxation. The layer grown directly on the lattice mismatched layer may have an in-plane lattice constant greater than 3.19 Å in some embodiments and greater than 3.2 Å in some embodiments.

In some embodiments, the difference between the in-plane lattice constant of first layer 30 and the bulk lattice constant of lattice mismatched layer 32 is at least 1%. In some embodiments, the difference between the in-plane lattice constant of first layer 30 and the bulk lattice constant of the layer grown over lattice mismatched layer 32 is no more than 1%. In some embodiments, the difference between the bulk lattice constant of the layer grown over the lattice mismatched layer and the in-plane lattice constant of the first layer 30 is sufficiently small that the layer grown over the lattice mismatched layer 32 would not substantially relax if grown directly on the first layer 30. Placing the lattice mismatched layer 32, which is heavily lattice-mismatched to both first layer 30 and the layer grown over the lattice mismatched layer, between first layer 30 and the layer grown over the lattice mismatched layer, may result in full or partial relaxation of both the lattice mismatched layer 32 and the layer grown over it.

The device layers 10 are grown over the lattice mismatched layer 32. The device layers 10 include a light emitting or active region 36 sandwiched between n- and p-type regions 34 and 38. N-type region 34 is typically grown first and may include multiple layers of different compositions and dopant concentration including, for example, preparation layers such as buffer layers or nucleation layers, which may be n-type or not intentionally doped, layers to facilitate later removal of the growth substrate, and n- or even p-type device layers designed for particular optical or electrical properties desirable for the light emitting region to efficiently emit light. Light emitting or active region 36 is grown over the n-type region 34. Examples of suitable light emitting regions include a single thick or thin light emitting layer, or a multiple quantum well light emitting region including multiple thin or thick quantum well light emitting layers separated by barrier layers. P-type region 38 is grown over the light emitting region.

Like the n-type region, the p-type region may include multiple layers of different composition, thickness, and dopant concentration, including layers that are not intentionally doped, or n-type layers.

Figure 3:
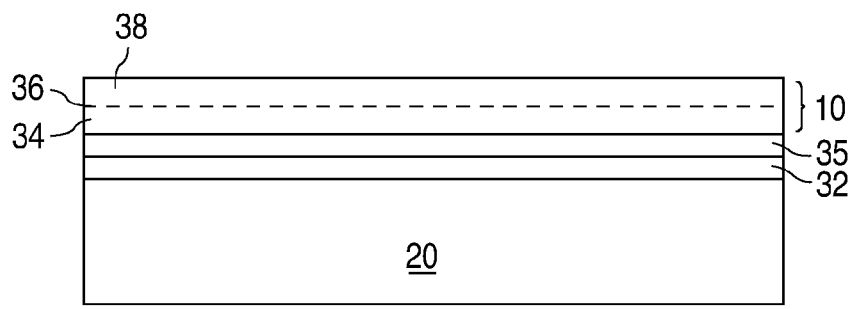
FIG. 3 illustrates a III-nitride epitaxial structure including a relaxed layer grown directly on a growth substrate.

FIG. 3 illustrates an epitaxial structure according to embodiments of the invention including a lattice mismatched layer 32 grown directly on a growth substrate 20. In the structure of FIG. 2, the layer grown directly on the lattice mismatched layer is part of n-type region 34 of device layers 10. In the structure of FIG. 3, the layer 35 grown directly on the lattice mismatched layer 32 is separate from the n-type region 34 of device layers 10. The lattice mismatched layer 32 and layer 35 grown directly on the lattice mismatched layer may have the same properties as described above in reference to FIG. 2.

Figure 4:
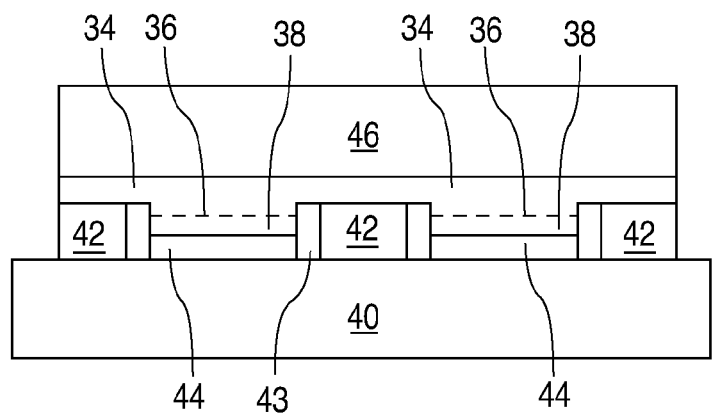
FIG. 4 illustrates a thin film flip chip device.
Figure 5:
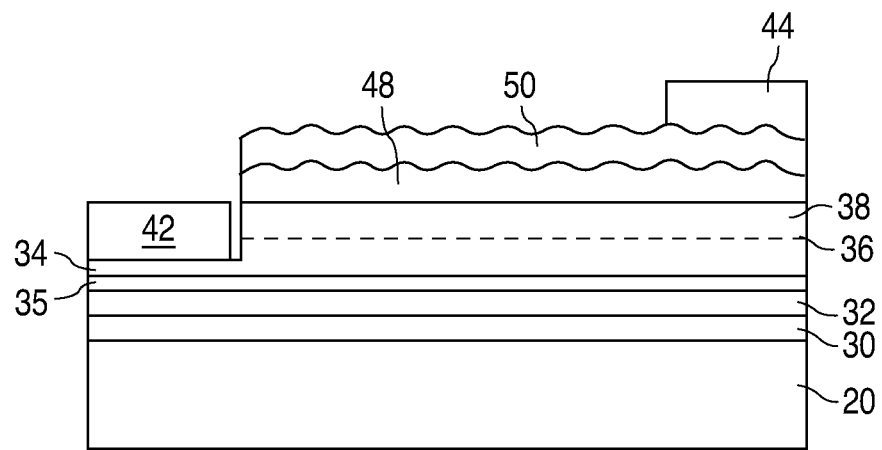
FIG. 5 illustrates a device with contacts formed on the same side of the device.
Figure 6:
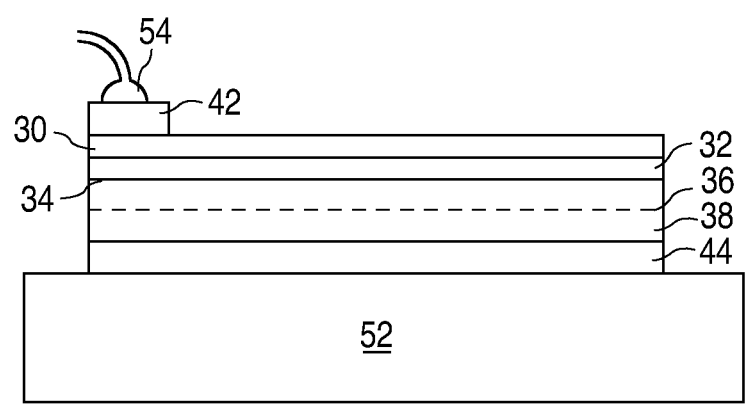
FIG. 6 illustrates a vertical injection device.

FIGS. 4, 5, and 6 illustrate devices including at least part of one of the epitaxial structures described above in reference to FIGS. 2 and 3.

In the device illustrated in FIG. 4, portions of the p-type region and active region of device layers 10 are etched away to expose an n-type layer for metallization. The n-type layer on which the n-contact is formed may be, for example, n-type region 34, first layer 30 of FIG. 2, or layer 35 of FIG. 3. P-contacts 44 are formed on one or more remaining portions of p-type region 38 and n-contacts 42 are formed on one or more exposed portions of an n-type layer (n-type region 34 in FIG. 4). In the device illustrated in FIG. 4, multiple n-contact regions are interposed by p-contact regions. In other embodiments, a single n-contact region and a single p-contact region are formed. The p-contact 44 and n-contact 42 are formed on the same side of the device. The contacts are generally reflective and the device is generally mounted such that light is extracted through the top surface of the device, n-type region 34 as shown in FIG. 4.

The device is mounted to a mount 40 through interconnects (not shown) between n- and p-contacts 42 and 44 and mount 40. For example, the interconnects may be gold-gold interconnects and the device may be attached to the mount by thermosonic bonding, or the interconnects may be solder and the device may be attached to the mount by reflow soldering. The growth substrate may be removed by a technique appropriate to the growth substrate, such as laser lift-off, etching, or a mechanical process such as grinding or chemical mechanical polishing. In some embodiments, the semiconductor structure includes a sacrificial semiconductor layer, which is implanted with an implant species such as $H^+$ that facilitates later separation of the semiconductor structure from the growth substrate. The semiconductor structure is separated from the growth substrate by activating the implanted species, for example by heating which causes the implanted area to expand and split the sacrificial layer. Implanting a sacrificial layer and separating a semiconductor structure from a growth substrate by activating the implant species is described in more detail in US Patent Application Publication 2005/0026394 and U.S. Pat. No. 5,374,564, which are incorporated herein by reference.

After removing the growth substrate, the epitaxial substrate may be thinned, for example by photoelectrochemical etching. In some embodiments, all or part of the epitaxial structure between substrate 20 and n-type region 34 illustrated in FIGS. 2 and 3 is removed during thinning The top surface of the epitaxial structure remaining after thinning may be textured to improve light extraction, for example by roughening or by patterning the surface with, for example, a lattice or photonic crystal structure. In some embodiments, growth substrate 20 of FIGS. 2 and 3 remains part of the device. A structure 46 known in the art, such as a wavelength converting element, a dichroic filter, or a lens may be formed over the epitaxial structure. Light is extracted from the device through structure 46.

In the device illustrated in FIG. 5, light is extracted from the device through the top surface of the epitaxial structure, i.e. the surface on which the n- and p-contacts 42 and 44 are formed. The device layers 10 are grown over a lattice mismatched layer 32 as described above. A rough p-type surface may be formed. For example, the top portion of p-type region 38 may be grown under conditions that form a rough surface, a separate, rough p-type layer 48 may be grown over p-type region 38, or a smooth surface of a p-type layer may be etched or roughened after growth, for example by photoelectrochemical etching. A layer of a transparent, conductive material 50 such as a transparent, conductive oxide is formed over the rough p-type surface. For example, transparent conductive material 50 may be indium tin oxide, zinc oxide, or ruthenium oxide. A portion of the p-type structure and light emitting region 36 are removed to expose an n-type layer. N-contact 42 is formed on the exposed n-type layer. P-contact 44 is formed on a portion of the transparent, conductive material 50. Material 50 spreads current laterally through the p-type region 38. N- and p-contacts 42 and 44 may be limited in extent or made transparent. The device may be mounted such that light is extracted through the surface of transparent material 50.

FIG. 6 illustrates a vertical injection LED. A p-contact 44 is formed on the surface of p-type region 38 and the epitaxial structure is attached to a mount 52 through p-contact 44. All or a portion of growth substrate 20 may be removed to expose the surface of an n-type region. An n-contact 42 is formed on the surface exposed by removing the substrate, or on another exposed n-type surface, such as a side surface of an n-type region. As illustrated in FIG. 6, n-contact 42 is formed on one side of the semiconductor structure, and a p-contact 44 is formed on the other side of the semiconductor structure. Electrical contact to the n-contact may be made with a wire bond 54 as illustrated in FIG. 6 or a metal bridge. The extent of the n-contact 42 may be limited as illustrated in FIG. 6 such that light may be extracted from the top of the device.

In some embodiments, a structure is included in the device to increase light extraction from the device, for example by increasing scattering. For example, a surface of the epitaxial structure may be roughened. In some embodiments, scattering is caused by a photonic crystal or lattice embedded in or formed on the surface of the III-nitride structure. In such a structure, changes in the optical index of refraction are provided in a periodic manner, at a spacing that is near the wavelength of light emitted by the light emitting region in the material. The parameters of the periodic index change, such as the period and amplitude, may be selected to increase the amount of light extracted into a desired emission pattern. For example, the size and spacing of a lattice or photonic crystal may be selected to maximize the amount of light extracted in a direction normal to a top surface of the semiconductor structure. Selecting the parameters for and forming a photonic crystal are described in more detail in U.S. Pat. Nos. 7,642,108, 7,442,965, 7,442,964, 7,294,862, 7,279,718, 7,012,279, and 6,956,247, all of which are incorporated herein by reference.

One or more wavelength converting materials may be disposed over the device to create white light or monochromatic light of other colors. Unconverted light emitted by the LED may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device. Multiple wavelength converting materials may be mixed in a single wavelength converting layer or formed as discrete layers. Examples of suitable wavelength converting structures include pre-formed ceramic phosphor layers that are glued or bonded to the LED, or a powder phosphor disposed in an organic encapsulant that is electrophoretically deposited, stenciled, screen printed, sprayed, sedimented, evaporated, sputtered, or otherwise dispensed over the LED.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a first semiconductor layer, wherein the first semiconductor layer is a III-nitride layer;
   a second semiconductor layer;
   a third semiconductor layer; and
   a semiconductor structure comprising a III-nitride light emitting layer disposed between an n-type region and a p-type region; wherein
   the second semiconductor layer is disposed between the first semiconductor layer and the third semiconductor layer;
   the third semiconductor layer is disposed between the second semiconductor layer and the light emitting layer, and the third semiconductor layer is a continuous layer of uniform composition that is as wide as the second semiconductor layer;
   a difference between an in-plane lattice constant of the first semiconductor layer and a bulk lattice constant of the third semiconductor layer is no more than 1%;
   a difference between an in-plane lattice constant of the first semiconductor layer and a bulk lattice constant of the second semiconductor layer is at least 1%; and
   the second semiconductor layer and the third semiconductor layer are at least partially relaxed.

2. The device of claim 1 wherein the third semiconductor layer relaxes over a thickness of not more than 500 nm.

3. The device of claim 1 wherein the third semiconductor layer has an in-plane lattice constant greater than 3.2 Å.

4. The device of claim 1 wherein the second semiconductor layer comprises aluminum.

5. The device of claim 1 wherein the second semiconductor layer comprises aluminum and the third semiconductor layer comprises indium.

6. The device of claim 1 wherein the second semiconductor layer is $Al_xGa_yN$, wherein x>0.3.

7. The device of claim 1 wherein the second semiconductor layer is AlN and the third semiconductor layer is InGaN.

8. The device of claim 1 wherein the second semiconductor layer is AlGaN and the third semiconductor layer is InGaN.

9. The device of claim 1 wherein the third semiconductor layer is part of the n-type region.

10. The device of claim 1 wherein the second semiconductor layer has a bulk lattice constant of 3.165 Å or less.

11. The device of claim 1 wherein the second semiconductor layer is in direct contact with the third semiconductor layer.

12. The device of claim 1 wherein the first semiconductor layer is GaN.

13. The device of claim 1 wherein:
   the third semiconductor layer comprises a first portion in direct contact with the second semiconductor layer, and a second portion;
   the first portion is disposed between the second semiconductor layer and the second portion;
   the first portion includes a greater number of defects than the second portion; and
   the second portion is relaxed.

* * * * *